US009059235B2

(12) United States Patent
Kondo et al.

(10) Patent No.: US 9,059,235 B2
(45) Date of Patent: Jun. 16, 2015

(54) SEMICONDUCTOR DEVICE AND METHOD OF MANUFACTURING THE SAME

(75) Inventors: Yoshiyuki Kondo, Yokohama (JP); Shigeru Kawanaka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 59 days.

(21) Appl. No.: 13/600,982

(22) Filed: Aug. 31, 2012

(65) Prior Publication Data

US 2013/0134504 A1    May 30, 2013

(30) Foreign Application Priority Data

Nov. 25, 2011    (JP) ................................. 2011-257618

(51) Int. Cl.
*H01L 29/78*     (2006.01)
*H01L 21/336*    (2006.01)
*H01L 29/739*    (2006.01)

(52) U.S. Cl.
CPC .................. *H01L 29/7391* (2013.01)

(58) Field of Classification Search
CPC ............ H01L 29/7813; H01L 29/4236; H01L 29/66734; H01L 29/1095; H01L 29/0696
USPC .............. 257/330, E21.41, E29.262; 438/270
See application file for complete search history.

(56) References Cited

U.S. PATENT DOCUMENTS

| 6,353,251 | B1 | 3/2002 | Kimura | |
|---|---|---|---|---|
| 6,753,242 | B2 * | 6/2004 | Yeap et al. | 438/595 |
| 7,812,370 | B2 * | 10/2010 | Bhuwalka et al. | 257/192 |
| 2009/0289298 | A1 | 11/2009 | Curatola | |
| 2011/0003448 | A1 * | 1/2011 | Park | 438/270 |
| 2012/0199917 | A1 | 8/2012 | Morooka | |
| 2012/0228706 | A1 | 9/2012 | Sugizaki et al. | |

FOREIGN PATENT DOCUMENTS

| JP | 8-195487 | 7/1996 |
|---|---|---|
| JP | 11-17184 | 1/1999 |
| JP | 11-163339 | 6/1999 |

(Continued)

OTHER PUBLICATIONS

U.S. Appl. No. 13/358,643, filed Jan. 26, 2012, Emiko Sugizaki, et al.

(Continued)

*Primary Examiner* — Monica D Harrison
(74) *Attorney, Agent, or Firm* — Oblon, McClelland, Maier & Neustadt, L.L.P.

(57) ABSTRACT

In one embodiment, a semiconductor device includes a substrate including a trench, and a gate electrode disposed at a position adjacent to the trench on the substrate, the gate electrode having a first side surface located on an opposite side of the trench, and a second side surface located on the same side as the trench. The device further includes a first sidewall insulator disposed on the first side surface, and a second sidewall insulator disposed on the second side surface and a side surface of the trench. The device further includes a source region of a first conductivity type disposed in the substrate on the same side as the first sidewall insulator with respect to the first side surface, and a drain region of a second conductivity type disposed in the substrate on the same side as the second sidewall insulator with respect to the second side surface.

18 Claims, 9 Drawing Sheets

(56) References Cited

FOREIGN PATENT DOCUMENTS

| | | |
|---|---|---|
| JP | 2000-174256 | 6/2000 |
| JP | 2000-174256 | 6/2000 |
| JP | 2001-119001 | 4/2001 |
| JP | 2006-147805 | 6/2006 |
| JP | 2012-190913 | 10/2012 |

OTHER PUBLICATIONS

F. Mayer, et al., "Impact of SOI, $Si_{1-x}Ge_xOI$ and GeOI substrates on CMOS compatible Tunnel FET performance", Electron Devices Meeting, IEDM 2008, International Dec. 2008, 5 pages.

Office Action issued on Aug. 1, 2014, in Japanese Patent Application No. 2011-257618 with English translation.

* cited by examiner

FIG.2A
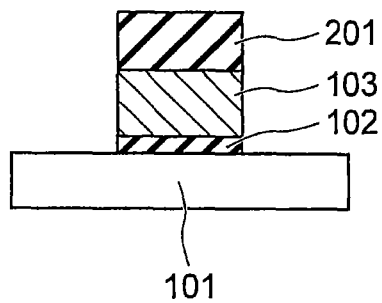
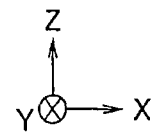
FIG.2B
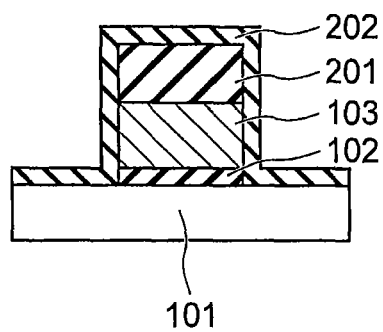
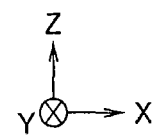
FIG.2C
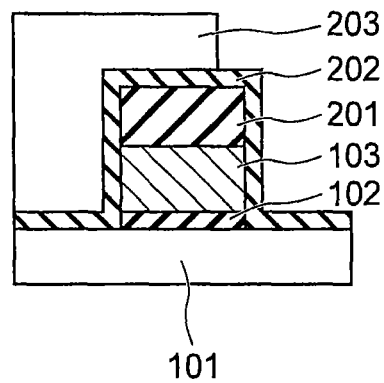
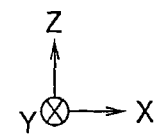
FIG.2D
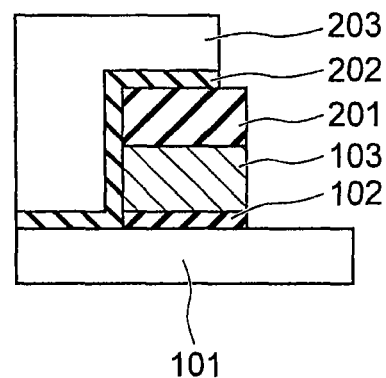
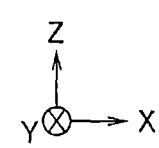

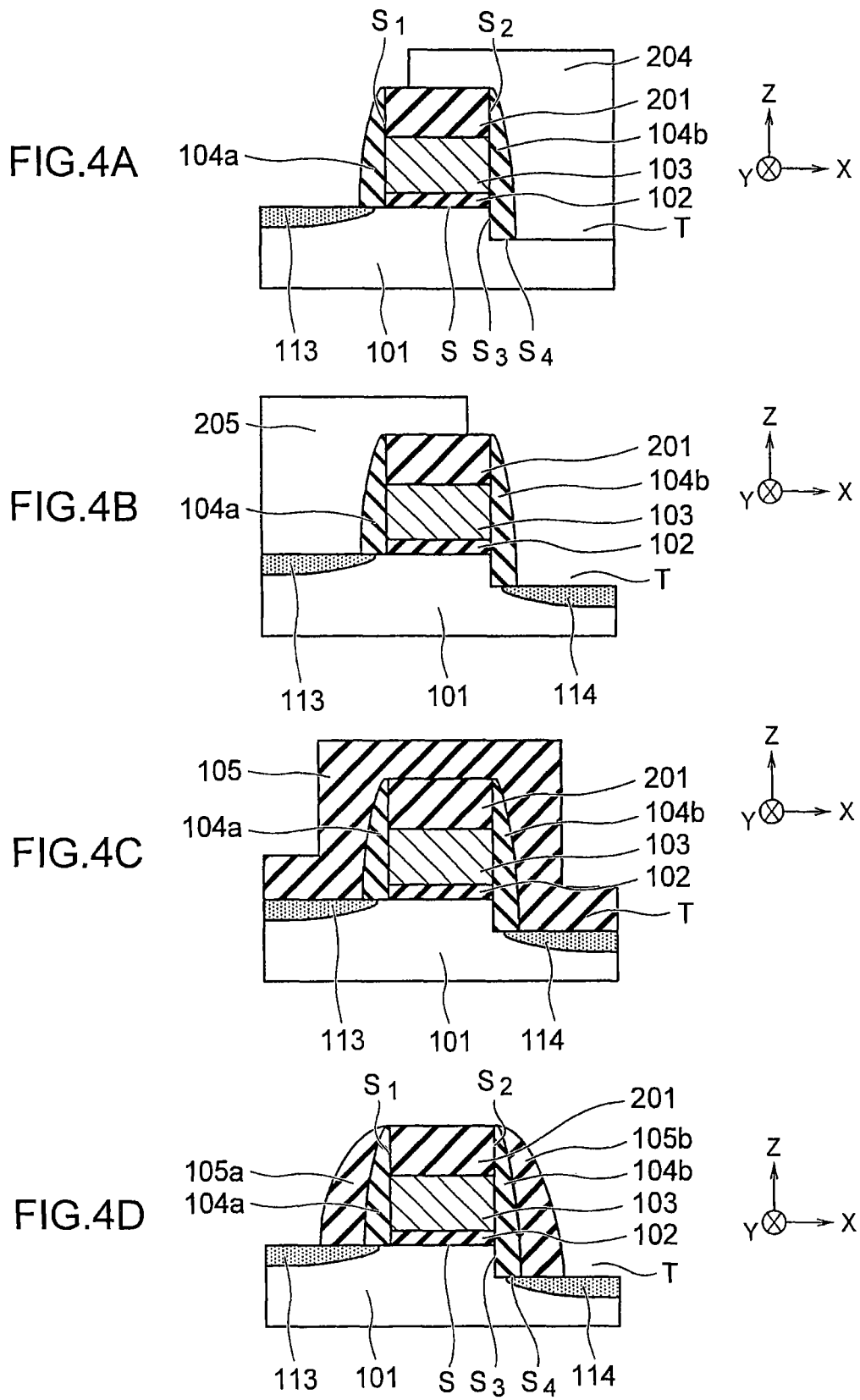

US 9,059,235 B2

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2011-257618, filed on Nov. 25, 2011, the entire contents of which are incorporated herein by reference.

FIELD

Embodiments described herein relate to a semiconductor device and a method of manufacturing the same.

BACKGROUND

In recent years, a tunnel FET (TFET) has been vigorously studied to achieve higher performance and lower power consumption compared to a MOSFET. In the tunnel FET, since conductivity types of source and drain regions differ from each other, bipolarity of the tunnel FET in which the FET is turned on regardless of whether a gate voltage is positive or negative raises a problem. This brings about an increase in off-state current and an increase in variation of characteristics of the tunnel FET. Although several solutions for suppressing the off-state current are proposed, many of them bring about harmful effects such as degradation in on-state current and reduction of sub-threshold swing (SS). Those effects become factors that hinder the reduction in power consumption of the tunnel FET.

BRIEF DESCRIPTION OF THE DRAWINGS

FIGS. 2A to 5D are sectional views showing a method of manufacturing the semiconductor device of the first embodiment;

DETAILED DESCRIPTION

Embodiments will now be explained with reference to the accompanying drawings.

In one embodiment, a semiconductor device includes a substrate including a trench, and a gate electrode disposed at a position adjacent to the trench on the substrate via a gate insulator, the gate electrode having a first side surface located on an opposite side of the trench, and a second side surface located on the same side as the trench. The device further includes a first sidewall insulator disposed on the first side surface of the gate electrode, and a second sidewall insulator disposed on the second side surface of the gate electrode and a side surface of the trench. The device further includes a source region of a first conductivity type disposed in the substrate, the source region being disposed on the same side as the first sidewall insulator with respect to the first side surface of the gate electrode, and a drain region of a second conductivity type disposed in the substrate, the drain region being disposed on the same side as the second sidewall insulator with respect to the second side surface of the gate electrode and the side surface of the trench.

(First Embodiment)

Figure 1:
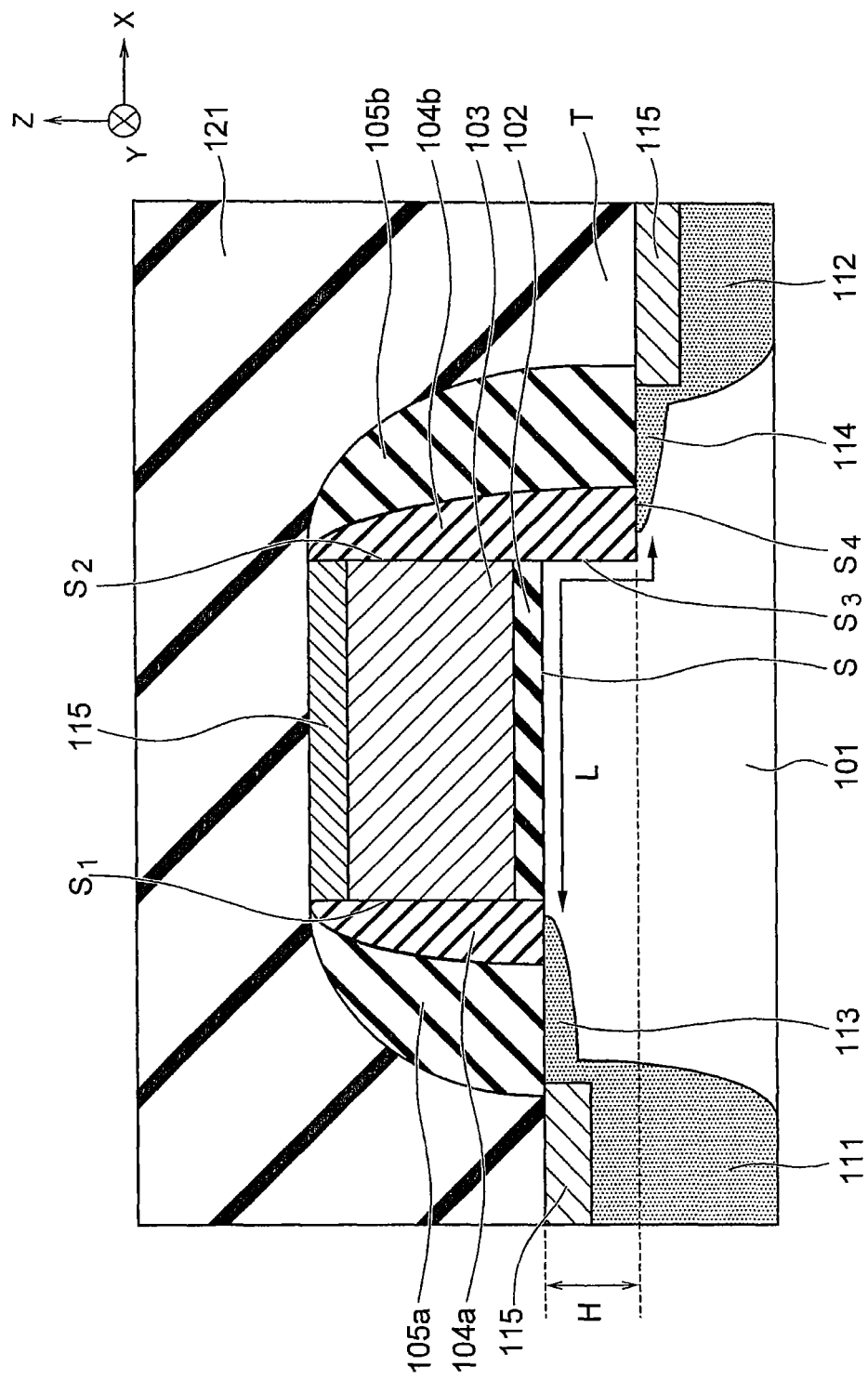
FIG. 1 is a sectional view showing a structure of a semiconductor device of a first embodiment.

FIG. 1 is a sectional view showing a structure of a semiconductor device of a first embodiment.

The semiconductor device of FIG. 1 includes a substrate 101, a gate insulator 102, a gate electrode 103, first and second sidewall insulators 104a and 104b, third and fourth sidewall insulators 105a and 105b, a source region 111, a drain region 112, a source extension region 113, a drain extension region 114, silicide layers 115, and an inter layer dielectric 121, as components of a tunnel FET.

The substrate 101 is a semiconductor substrate such as an Si substrate, a GaAs substrate, or an InP substrate, for example. FIG. 1 shows X and Y directions which are parallel to a principal surface of the substrate 101 and are perpendicular to each other, and a Z direction which is perpendicular to the principal surface of the substrate 101. The substrate 101 has a trench T extending in the Y direction as shown in FIG. 1. Reference characters $S_3$ and $S_4$ denote a side surface and a bottom surface of the trench T, respectively. The substrate 101 of the present embodiment is an i-type substrate, or a p-type or n-type substrate having a lower impurity concentration than the source region 111 and the drain region 112. The substrate 101 may be a silicon on insulator (SOI) substrate or a germanium on insulator (GOI) substrate.

The gate electrode 103 is formed at a position adjacent to the trench T, on the substrate 101 via the gate insulator 102. Examples of the gate insulator 102 include a silicon oxide layer ($SiO_2$), a silicon oxynitride layer (SiON), a high-k insulator and the like. Examples of the gate electrode 103 include a polysilicon layer, a silicide layer, a metal layer, a stack layer including two or more kinds of those layers and the like. Reference characters $S_1$ and $S_2$ denote first and second side surfaces of the gate electrode 103, respectively. The first side surface $S_1$ is located on an opposite side of the trench T, and the second side surface $S_2$ is located on the same side as the trench T.

The first sidewall insulator 104a is formed on the first side surface $S_1$ of the gate electrode 103. The second sidewall insulator 104b is formed on the second side surface $S_2$ of the gate electrode 103 and the side surface $S_3$ of the trench T. Therefore, a height of a bottom surface of the second sidewall insulator 104b is lower than a height of a top surface S of the substrate 101, and a height of a bottom surface of the first sidewall insulator 104a. Examples of the first and second sidewall insulators 104a and 104b include a silicon oxide layer, a silicon nitride layer (SiN) and the like.

The third sidewall insulator 105a is formed on the first side surface $S_1$ of the gate electrode 103 via the first sidewall insulator 104a. The fourth sidewall insulator 105b is formed on the second side surface $S_2$ of the gate electrode 103 and the side surface $S_3$ of the trench T via the second sidewall insulator 104b. Therefore, a height of a bottom surface of the fourth sidewall insulator 105b is lower than a height of the top surface S of the substrate 101, and a height of a bottom surface of the third sidewall insulator 105a. Examples of the third and fourth sidewall insulators 105a and 105b include a silicon oxide layer, a silicon nitride layer and the like.

The source and drain regions 111 and 112 are formed in the substrate 101 to sandwich the gate electrode 103. More specifically, the source region 111 is formed on the same side as the first sidewall insulator 104a with respect to the first side surface $S_1$ of the gate electrode 103, in the substrate 101. In addition, the drain region 112 is formed on the same side as the second sidewall insulator 104b with respect to the second side surface $S_2$ of the gate electrode 103 and the side surface $S_3$ of the trench T, in the substrate 101. In the present embodiment, the source region 111 is a p-type region, and the drain region 112 is an n-type region which is a reverse conductivity type from that of the source region 111. The p-conductivity type and the conductivity type are examples of a first conductivity type and a second conductivity type, respectively.

The source extension region 113 is formed under the first and third sidewall insulators 104a and 105a between the source and drain regions 111 and 112. The drain extension region 114 is formed under the second and fourth sidewall insulators 104b and 105b between the source and drain regions 111 and 112.

In the present embodiment, the source and drain extension regions 113 and 114 are p-type and n-type regions, respectively.

The silicide layers 115 are formed in upper portions of the gate electrode 103, the source region 111 and the drain region 112. Examples of the silicide layers 115 include NiSi layers, PtSi layers, NiPtSi layers, NiCoSi layers, $Co_2Si$ layers and the like. When the substrate 101 and the gate electrode 103 are formed of semiconductor other than silicon (e.g., germanium), alloy layers containing this semiconductor and metal may be formed in place of the silicide layers 115. Examples of the alloy layers include NiGe layers and the like.

The inter layer dielectric 121 is formed on the substrate 101 to cover the tunnel FET. Examples of the inter layer dielectric 121 include a silicon oxide layer and the like.

Although the tunnel FET of FIG. 1 is an n-type FET, it may be a p-type FET. In this case, the source region 111 and the source extension region 113 become n-type regions, and the drain region 112 and the drain extension region 114 become p-type regions.

Although the tunnel FET of FIG. 1 includes the source and drain extension regions 113 and 114, it may include only the source extension region 113 without including the drain extension region 114. In this case, the step of FIG. 4B (the step to form the drain extension region 114) described later is not needed.

The second sidewall insulator 104b may include a first portion formed on the second side surface $S_2$ of the gate electrode 103 and formed of a first insulating material, and a second portion formed on the side surface $S_3$ of the trench T and formed of a second insulating material different from the first insulating material. In other words, the first portion formed on the second side surface $S_2$ and the second portion formed on the side surface $S_3$ may be formed of different insulating materials.

Likewise, the fourth sidewall insulator 105b may include a third portion formed on the second side surface $S_2$ of the gate electrode 103 and formed of a third insulating material, and a fourth portion formed on the side surface $S_3$ of the trench T and formed of a fourth insulating material different from the third insulating material.

(1) Advantages of Tunnel FET of First Embodiment

As described above, the second sidewall insulator 104b of FIG. 1 is formed on the second side surface $S_2$ of the gate electrode 103 and the side surface $S_3$ of the trench T. As a result, a bottom portion of the second sidewall insulator 104b is disposed lower than the gate insulator 102. Hereinafter, advantages of the tunnel FET having such second sidewall insulator 104b will be described.

When a positive voltage is applied to the gate electrode 103 of FIG. 1, electrons occupying a valence band of the source region 111 move to a conduction band in the channel region by the tunnel effect called band to band tunneling (BTBT). The electrons then reach the drain region 112, so that an on-state current flows between the source and drain regions 111 and 112.

On the other hand, when a negative voltage is applied to the gate electrode 103, electrons occupying a valence band of the channel region move to a conduction band in the drain region 112 by the BTBT. Holes generated in the channel region with the movement of the electrons then reach the source region 111, so that an off-state current flows between the source and drain regions 111 and 112. This current is called a gate induced drain leakage (GIDL) current.

In general, the BTBT which becomes the cause of the GIDL current is generated at an edge portion of the drain region 112. According to the second sidewall insulator 104b of the present embodiment, the tunneling probability of the electrons according to this BTBT is decreased, so that the GIDL current can be reduced. The reason is that an effective channel length "L" of the tunnel FET can be made long by the second sidewall insulator 104b. The increase of the effective channel length "L" increases the tunneling distance of BTBT, and the increase of the tunneling distance exponentially decreases the tunneling probability. In the present embodiment, the effective channel length "L" becomes longer than the original channel length correspondingly to a depth "H" of the trench T.

The second sidewall insulator 104b functions as a barrier against the electrons which move between the channel region and the drain region 112. In this viewpoint, an insulator with a large band gap is desirably used as the material of the second sidewall insulator 104b. The reason is that the tunneling probability can be decreased by interposing the material with a large band gap in the tunneling path. The tunneling probability exponentially decreases with increase of the band gap. Therefore, the GIDL current in the present embodiment can be further reduced by the second sidewall insulator 104b with a large band gap.

Whereas the BTBT which becomes the cause of the GIDL current is generated at the edge portion of the drain region 112, the BTBT which generates an on-state current is generated at an edge portion of the source region 111. In the present embodiment, although the bottom portion of the second sidewall insulator 104b is disposed lower than the gate insulator 102, the bottom portion of the first sidewall insulator 104a is not disposed lower than the gate insulator 102. Therefore, according to the present embodiment, the GIDL current can be decreased without decreasing the on-state current.

It is known that an increase in channel length of the MOSFET reduces the on-state current, but the on-state current of the tunnel FET hardly depends on the channel length. Therefore, even if the effective channel length "L" is made long in the present embodiment, a large decrease in the on-state current can be avoided.

As described above, the bottom portion of the second sidewall insulator 104b in the present embodiment is formed in a position deeper than the gate insulator 102. Therefore, the off-state current in the present embodiment can be reduced while the degradation of the on-state current in the tunnel FET is suppressed. As a result, the problem of bipolarity of the switching in the tunnel FET can be solved in the present embodiment.

(2) Method of Manufacturing Semiconductor Device

A method of manufacturing the semiconductor device of the first embodiment will be described with reference to FIGS. 2A to 5D. FIGS. 2A to 5D are sectional views showing the method of manufacturing the semiconductor device of the first embodiment.

First, the substrate 101 is prepared (FIG. 2A). The substrate 101 is, for example, a silicon substrate. Next, isolation regions are formed in predetermined regions in the substrate 101 by using a shallow trench isolation (STI) method or the like. The gate insulator 102 is then formed on a surface of a device region in the substrate 101 (FIG. 2A). For example, the gate insulator 102 is a silicon oxide layer formed by thermal oxidation.

An electrode material for the gate electrode 103 is then deposited on an entire surface of the substrate 101 (FIG. 2A). The electrode material is, for example, a polysilicon layer. An insulating material for a cap layer 201 is then deposited on the entire surface on the substrate 101 (FIG. 2A). The insulating material is, for example, a silicon nitride layer.

The insulating material and the electrode material are then etched by lithography and reactive ion etching (RIE). As a result, as shown in FIG. 2A, the gate electrode 103 is formed on the substrate 101 via the gate insulator 102.

As shown in FIG. 2B, a liner layer 202 is then deposited on the entire surface of the substrate 101 by chemical vapor deposition (CVD). The liner layer 202 is, for example, a silicon nitride layer.

As shown in FIG. 2C, a resist layer 203 which covers a region where the source region 111 is to be is then formed by lithography. As shown in FIG. 2D, the liner layer 202 is etched by wet etching with the resist layer 203 as a mask.

Figure 3A:
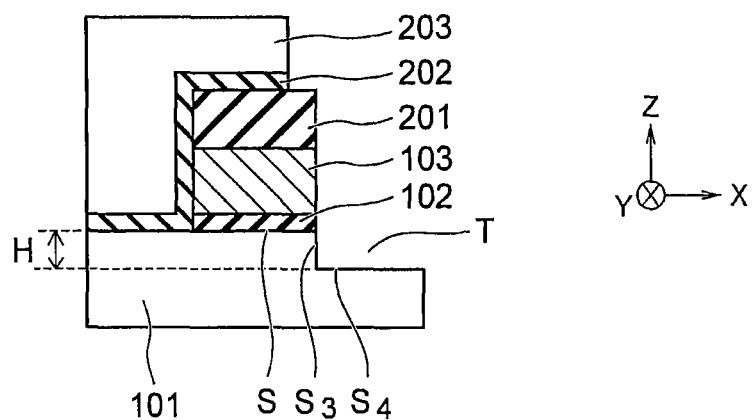
Figure 3B:
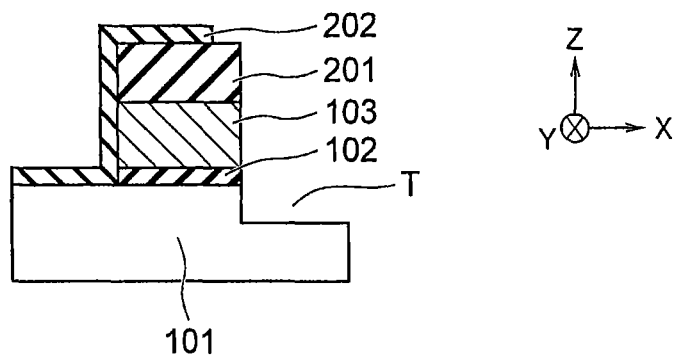
Figure 3C:
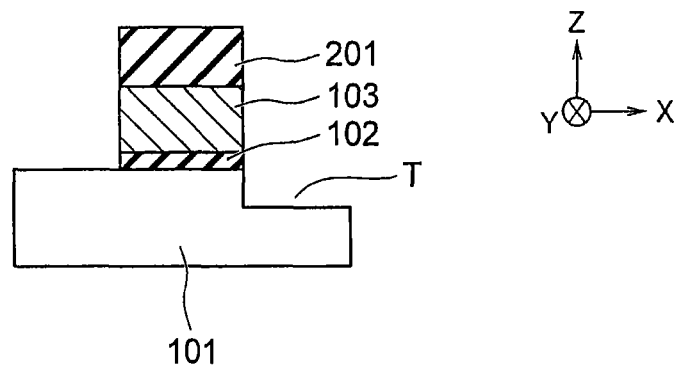

As shown in FIG. 3A, the substrate 101 is etched by RIE with the resist layer 203 and the liner layer 202 as a mask. As a result, the trench T is formed to be adjacent to the gate electrode 103 in the substrate 101. The timing for stopping the etching is controlled in accordance with time. As shown in FIGS. 3B and 3C, the resist layer 203 and the liner layer 202 are then removed.

Figure 3D:
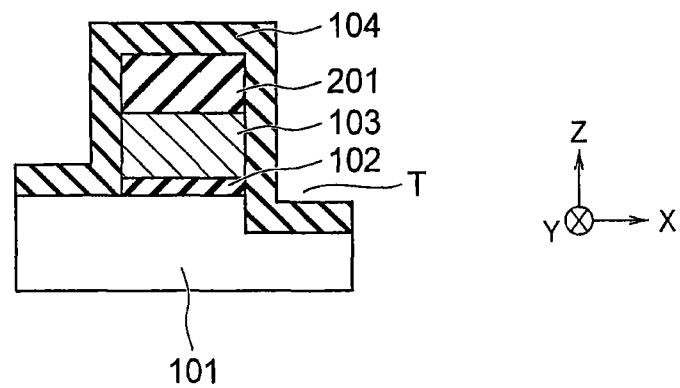

As shown in FIG. 3D, an insulating layer 104 to be a material of the first and second sidewall insulators 104a and 104b is then deposited by CVD. The insulating layer 104 is, for example, a silicon oxide layer. As shown in FIG. 4A, the insulating layer 104 is processed by RIE. As a result, the first sidewall insulator 104a is formed on the first side surface $S_1$ of the gate electrode 103. In addition, the second sidewall insulator 104b is formed on the second side surface $S_2$ of the gate electrode 103 and the side surface $S_3$ of the trench T.

As shown in FIG. 4A, a resist layer 204 which covers a region where the drain region 112 is to be formed is formed by lithography. Impurity ions are then implanted into the substrate 101 by using the resist layer 204 as a mask. As a result, the source extension region 113 is formed in the substrate 101 by the subsequent annealing or the like.

As shown in FIG. 4B, a resist layer 205 which covers the region where the source region 111 is to be formed is formed by lithography. Impurity ions are then implanted into the substrate 101 by using the resist layer 205 as a mask. As a result, the drain extension region 114 is formed in the substrate 101 by the subsequent annealing or the like. The process step of FIG. 4B is carried out so that the drain extension region 114 is not formed directly under the gate electrode 103.

As shown in FIG. 4C, an insulating layer 105 to be a material of the third and fourth sidewall insulators 105a and 105b is then deposited by CVD. The insulating layer 105 is, for example, a silicon oxide layer. As shown in FIG. 4D, the insulating layer 105 is processed by RIE. As a result, the third sidewall insulator 105a is formed on the first side surface $S_1$ of the gate electrode 103 via the first sidewall insulator 104a. In addition, the fourth sidewall insulator 105b is formed on the second side surface $S_2$ of the gate electrode 103 and the side surface $S_3$ of the trench T via the second sidewall insulator 104b.

Figure 5A:
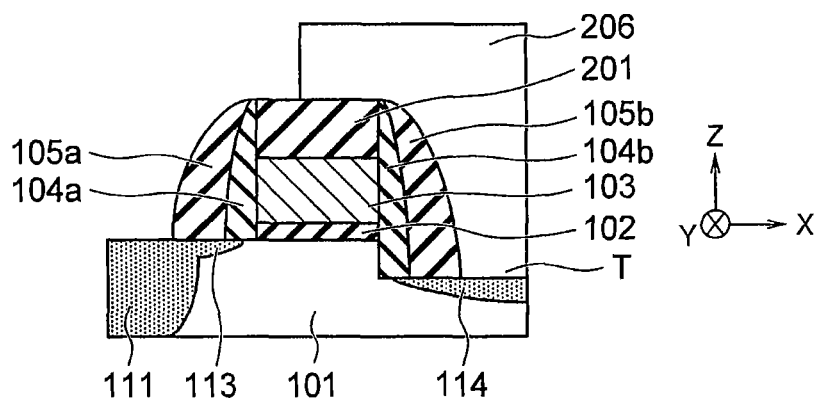

As shown in FIG. 5A, a resist layer 206 which covers the region where the drain region 112 is to be formed is formed by lithography. Impurity ions are then implanted into the substrate 101 by using the resist layer 206 as a mask. As a result, the source region 111 is formed in the substrate 101 by the subsequent annealing or the like. The source region 111 is formed to have an impurity concentration profile deeper than that of the source extension region 113. The resist layer 206 is then removed.

Figure 5B:
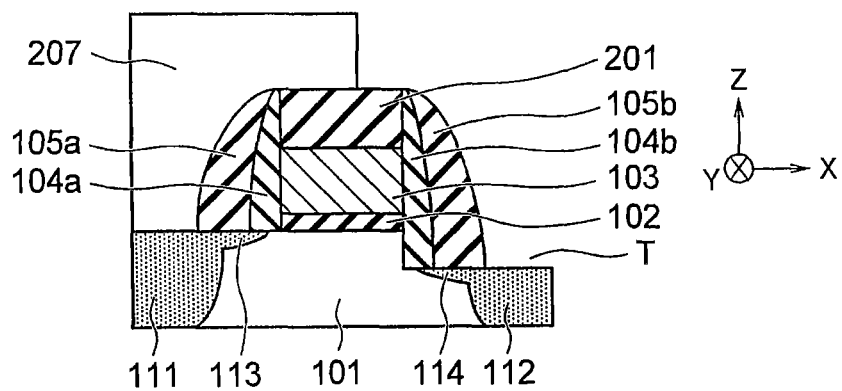

As shown in FIG. 5B, a resist layer 207 which covers the region where the source region 111 is to be formed is formed by lithography. Impurity ions are then implanted into the substrate 101 by using the resist layer 207 as a mask. As a result, the drain region 112 is formed in the substrate 101 by the subsequent annealing or the like. The drain region 112 is formed to have an impurity concentration profile deeper than that of the drain extension region 114. The resist layer 207 is then removed.

Figure 5C:
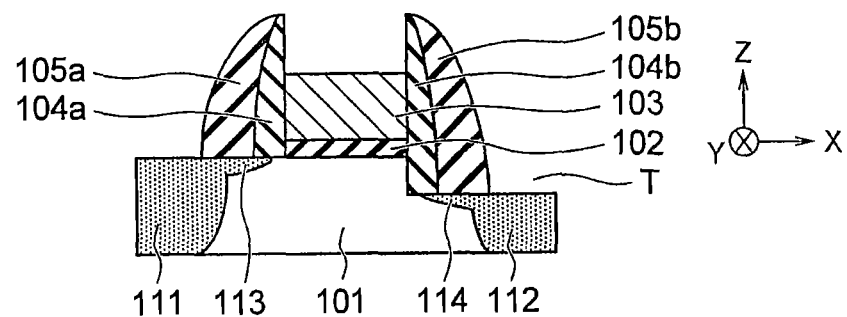

As shown in FIG. 5C, the cap layer 201 is then removed by wet etching or the like. The cap layer 201 in the present embodiment is formed of the material with which sufficient etching selectivity ratios are obtained against the first to fourth sidewall insulators 104a to 105b. Protruded portions of the first to fourth sidewall insulators 104a to 105b may remain as they are, or may be removed by chemical mechanical polishing (CMP) or the like.

Figure 5D:
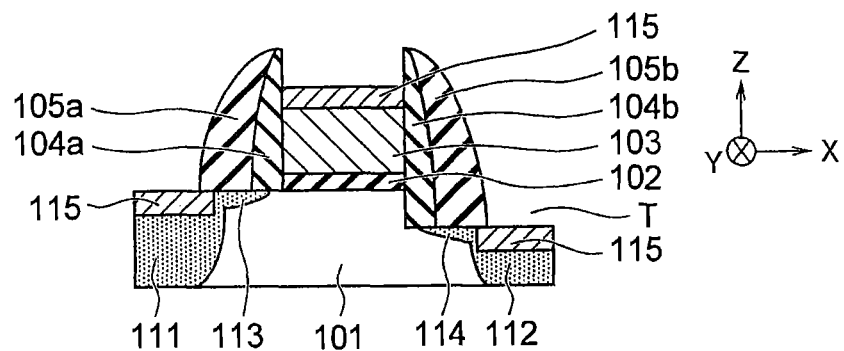

As shown in FIG. 5D, the silicide layers 115 are formed in the upper portions in the gate electrode 103, the source region 111 and the drain region 112 by a salicide process. The silicide layers 115 are, for example, NiSi layers.

In the present embodiment, inter layer dielectrics, contact plugs, via plugs, interconnect layers and the like are then formed on the substrate 101. In this manner, the semiconductor device of FIG. 1 is manufactured.

Although the flow of FIGS. 2A to 5D is a manufacture flow of the n-type TFET, a p-type TFET can be also manufactured by the flow similar to this.

As described above, the second sidewall insulator 104b in the present embodiment is formed on the second side surface $S_2$ of the gate electrode 103 and the side surface $S_3$ of the trench T, and the bottom portion of the second sidewall insulator 104b is formed in the position deeper than the gate insulator 102. Therefore, according to the present embodiment, the off-state current can be reduced while the degradation of the on-state current of the tunnel FET is suppressed.

(Second Embodiment)

Figure 6:
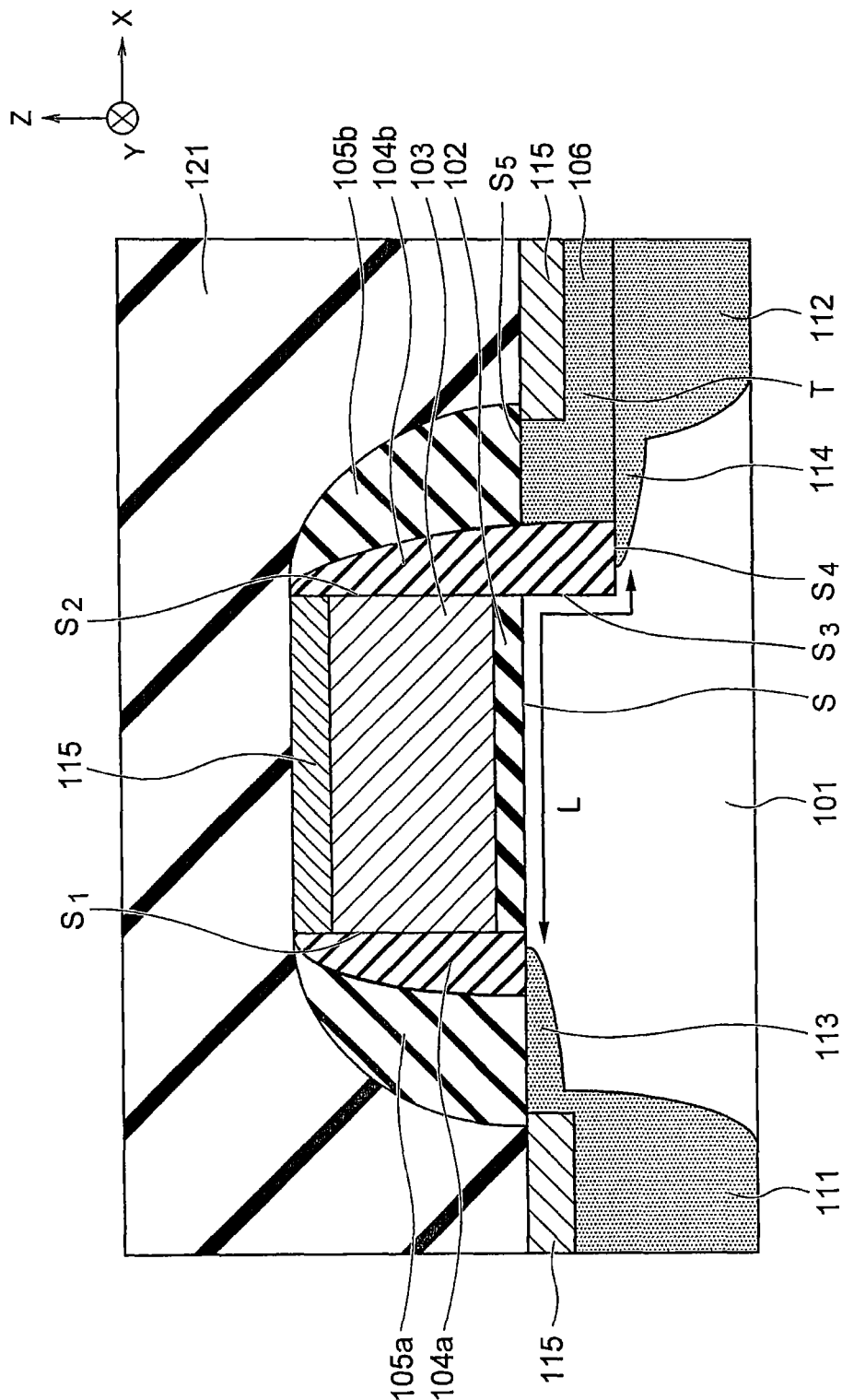
FIG. 6 is a sectional view showing a structure of a semiconductor device of a second embodiment.

FIG. 6 is a sectional view showing a structure of a semiconductor device of a second embodiment.

The semiconductor device of FIG. 6 includes a semiconductor layer 106 in addition to the components shown in FIG. 1. The semiconductor layer 106 is formed to be adjacent to the second sidewall insulator 104b in the trench T. The semiconductor layer 106 in the present embodiment is formed of the same material as the substrate 101. However, the semiconductor layer 106 may be formed from a material different from that of the substrate 101. Examples of the semiconductor layer 106 include an Si layer, an SiGe layer, a Ge layer and the like.

In the present embodiment, the fourth sidewall insulator 105b, the drain region 112, and the drain extension region 114 are formed after the semiconductor layer 106 is formed as described later. Therefore, the fourth sidewall insulator 105b is formed on the second side surface $S_2$ of the gate electrode 103 via the second sidewall insulator 104b, on a top surface of semiconductor layer 106. Furthermore, the drain region 112 and the drain extension region 114 are continuously formed in the substrate 101 and in the semiconductor layer 106.

Reference character $S_5$ shown in FIG. 6 shows the top surface of the semiconductor layer 106. In the present embodiment, a height of the top surface $S_5$ of the semiconductor layer 106 is substantially equal to the height of the top surface S of the substrate 101, but may be higher or lower than the height of the top surface S of the substrate 101.

The silicide layer 115 in the drain region 112 is formed in the semiconductor layer 106 in the present embodiment. This silicide layer 115 may be formed continuously in the drain region 112 and in the drain extension region 114. Such a structure has an advantage of being capable of suppressing a junction leak current. In this case, the thickness of the semiconductor layer 106 is desirably set at 20 nm or more in order to easily form the silicide layer 115 in the drain extension region 114.

Although the tunnel FET of FIG. 6 includes the source and drain extension regions 113 and 114, it may include only the source extension region 113 without including the drain extension region 114. In this case, the step of FIG. 8B (the step to form the drain extension region 114) described later is not needed.

(1) Method of Manufacturing Semiconductor Device

A method of manufacturing the semiconductor device of the second embodiment will be described with reference to FIGS. 7A to 9D. FIGS. 7A to 9D are sectional views showing the method of manufacturing the semiconductor device of the second embodiment.

First, the process steps of FIGS. 2A to 4A are carried out similarly to the first embodiment.

Figure 7A:
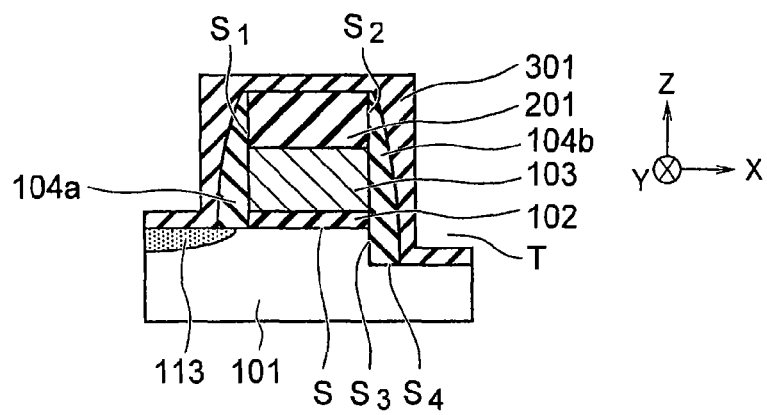
FIGS. 7A to 9D are sectional views showing a method of manufacturing the semiconductor device of the second embodiment.

As shown in FIG. 7A, a liner layer 301 is then deposited on the entire surface of the substrate 101. The liner layer 301 is, for example, a silicon nitride layer.

Figure 7B:
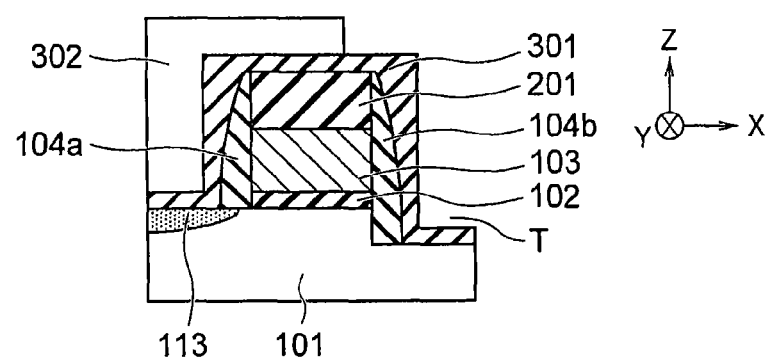
Figure 7C:
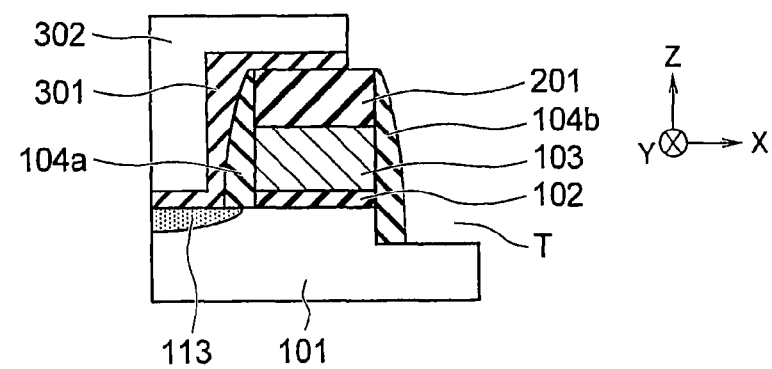

As shown in FIG. 7B, a resist layer 302 which covers the region where the source region 111 is to be formed is then formed by lithography. As shown in FIG. 7C, the liner layer 301 is etched by wet etching by using the resist layer 302 as a mask. The liner layer 301 in the present embodiment is formed of a material with which sufficient etching selectivity ratios are obtained against the first and second sidewall insulators 104a and 104b. The resist layer 302 is then removed.

Figure 7D:
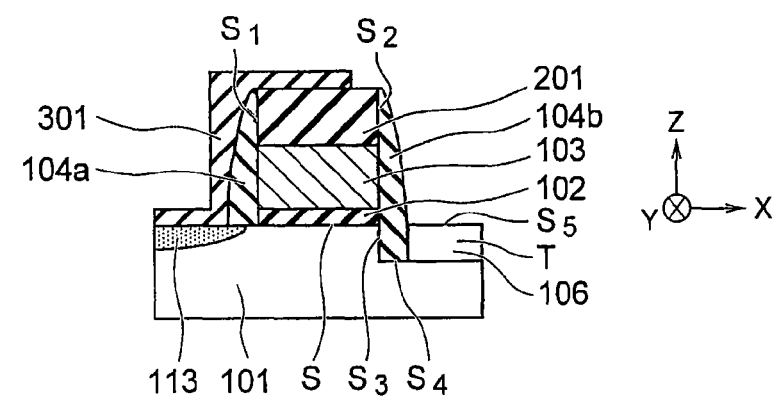
Figure 8A:
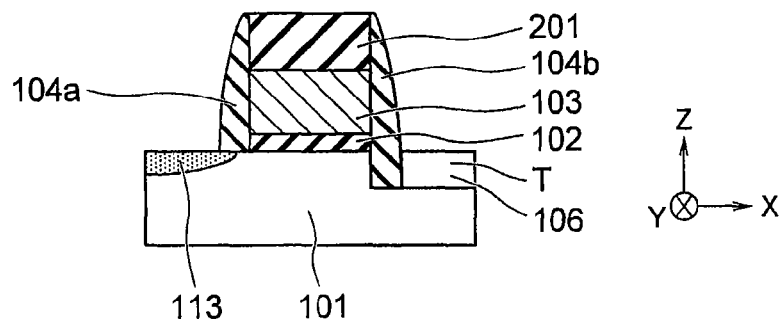

As shown in FIG. 7D, the semiconductor layer 106 is then formed to be adjacent to the second sidewall insulator 104b in the trench T by epitaxial CVD. The semiconductor layer 106 is, for example, a silicon layer. As shown in FIG. 8A, the liner layer 301 is then removed by wet etching.

Figure 8B:
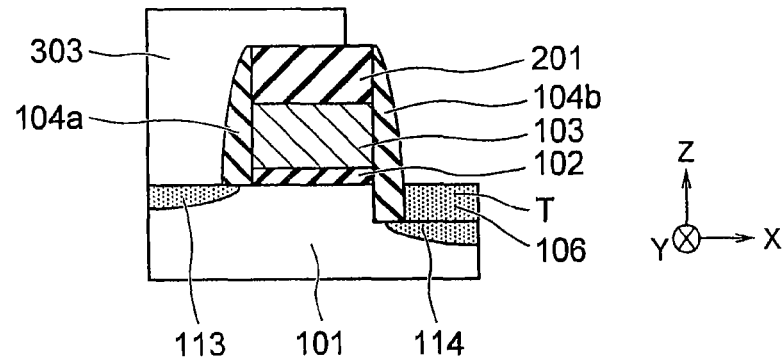
Figure 8C:
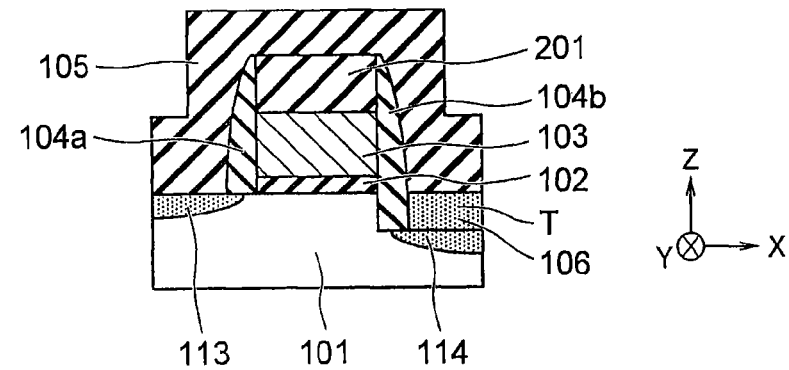
Figure 8D:
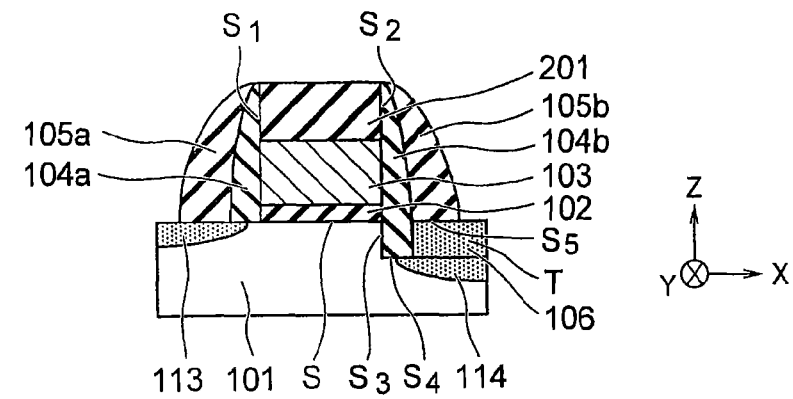
Figure 9A:
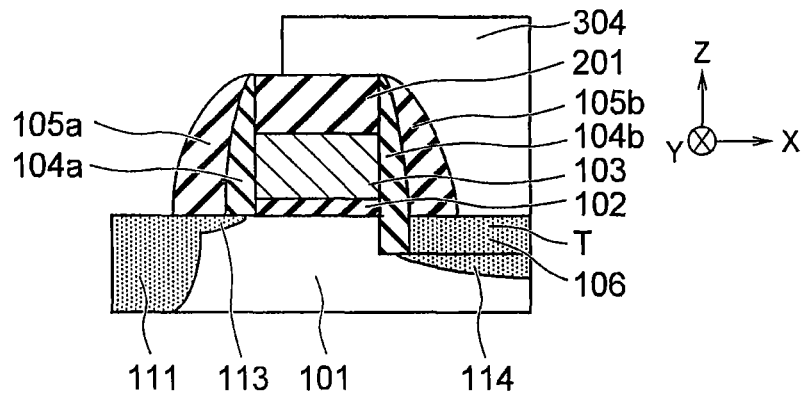
Figure 9B:
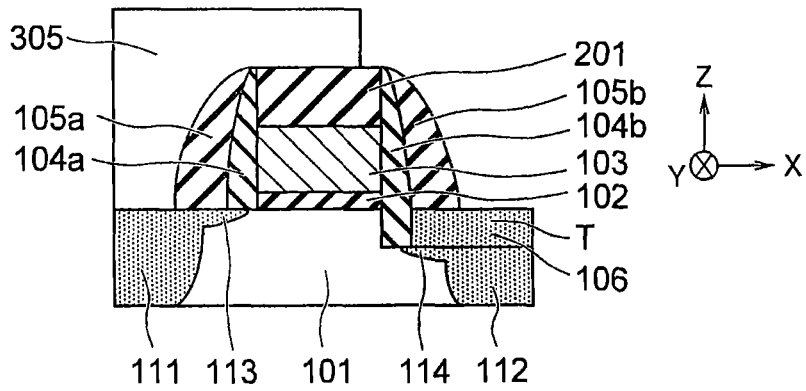
Figure 9C:
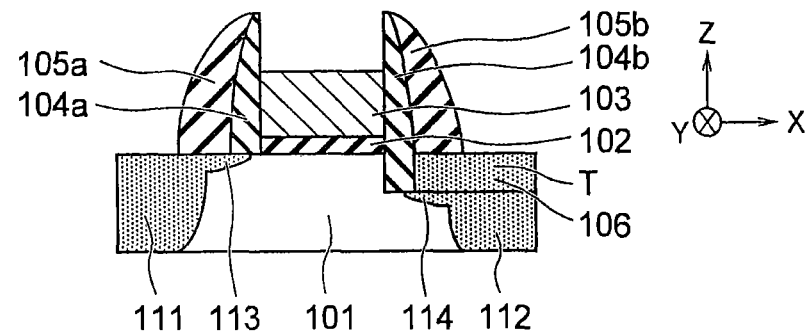
Figure 9D:
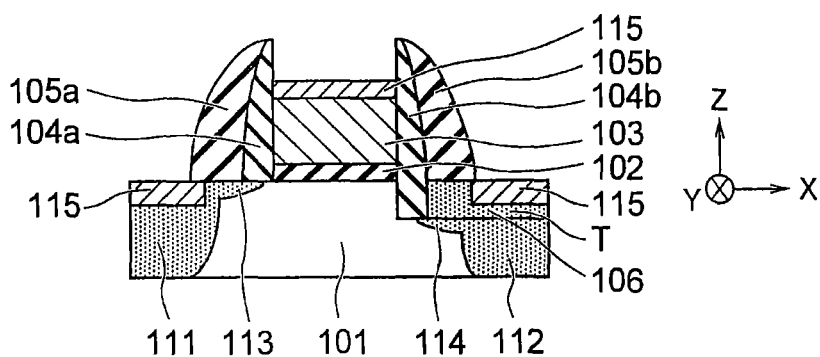

As shown in FIG. 8B, a resist layer 303 which covers the region where the source region 111 is to be formed is then formed by lithography. Impurity ions are then implanted into the semiconductor layer 106 and the substrate 101 by using the resist layer 303 as a mask. As a result, the drain extension region 114 is formed in the semiconductor layer 106 and the substrate 101 by the following annealing or the like. The process step of FIG. 8B is carried out so that the drain extension region 114 is not formed directly under the gate electrode 103.

Next, the process steps of FIGS. 8C to 9D are carried out similarly to the process steps of FIGS. 4C to 5D. Reference characters 304 and 305 denote resist layers.

In the present embodiment, inter layer dielectrics, contact plugs, via plugs, interconnect layers and the like are then formed on the substrate 101. In this manner, the semiconductor device of FIG. 6 is manufactured.

As described above, the second sidewall insulator 104b in the present embodiment is formed on the second side surface $S_2$ of the gate electrode 103 and the side surface $S_3$ of the trench T, and the bottom portion of the second sidewall insulator 104b is formed in the position deeper than the gate insulator 102. Therefore, according to the present embodiment, the off-state current can be reduced while the degradation of the on-state current of the tunnel FET is suppressed similarly to the first embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate including a trench;
a gate electrode disposed at a position adjacent to the trench on the substrate via a gate insulator, the gate electrode having a first side surface located on an opposite side of the trench, and a second side surface located on the same side as the trench, wherein a height of a lowermost surface of the gate electrode is higher than a height of an uppermost surface of the substrate at the position adjacent to the trench;
a first sidewall insulator disposed on the first side surface of the gate electrode;
a second sidewall insulator disposed on the second side surface of the gate electrode and a side surface of the trench, wherein a height of a bottom surface of the second sidewall insulator is lower than a height of a bottom surface of the first sidewall insulator;
a source region of a first conductivity type disposed in the substrate, the source region being disposed on the same side as the first sidewall insulator with respect to the first side surface of the gate electrode; and
a drain region of a second conductivity type disposed in the substrate, the drain region being disposed on the same side as the second sidewall insulator with respect to the second side surface of the gate electrode and the side surface of the trench.

2. The device of claim 1, further comprising:
a third sidewall insulator disposed on the first side surface of the gate electrode via the first sidewall insulator; and
a fourth sidewall insulator disposed on the second side surface of the gate electrode and the side surface of the trench via the second sidewall insulator.

3. The device of claim 2, wherein a height of a bottom surface of the fourth sidewall insulator is lower than a height of a bottom surface of the third sidewall insulator.

4. The device of claim 1, further comprising:
a semiconductor layer disposed to be adjacent to the second sidewall insulator in the trench;
a third sidewall insulator disposed on the first side surface of the gate electrode via the first sidewall insulator; and
a fourth sidewall insulator disposed on the second side surface of the gate electrode via the second sidewall insulator, the fourth sidewall insulator being disposed on a top surface of the semiconductor layer.

5. The device of claim 4, wherein the drain region is continuously disposed in the substrate and in the semiconductor layer.

6. The device of claim 4, wherein a height of the top surface of the semiconductor layer is higher or lower than a height of a top surface of the substrate.

7. The device of claim 4, wherein a thickness of the semiconductor layer is 20 nm or more.

8. The device of claim 4, wherein the semiconductor layer is formed of the same material as the substrate.

9. The device of claim 4, wherein the semiconductor layer is formed of a different material from the substrate.

10. The device of claim 1, further comprising:
a source extension region of a first conductivity type disposed under the first sidewall insulator between the source and drain regions; and
a drain extension region of a second conductivity type disposed under the second sidewall insulator between the source and drain regions.

11. A method of manufacturing a semiconductor device, the method comprising:
forming a gate electrode on a substrate via a gate insulator;
forming a trench in the substrate to be adjacent to the gate electrode, such that a height of a lowermost surface of the gate electrode is higher than a height of an uppermost surface of the substrate at a position adjacent to the trench;
forming a first sidewall insulator on a first side surface of the gate electrode;
forming a second sidewall insulator on a second side surface of the gate electrode and a side surface of the trench, wherein a height of a bottom surface of the second sidewall insulator is set lower than a height of a bottom surface of the first sidewall insulator;
forming a source region of a first conductivity type on the same side as the first sidewall insulator with respect to the first side surface of the gate electrode, in the substrate; and
forming a drain region of a second conductivity type on the same side as the second sidewall insulator with respect to the second side surface of the gate electrode and the side surface of the trench, in the substrate.

12. The method of claim 11, further comprising:
forming a third sidewall insulator on the first side surface of the gate electrode via the first sidewall insulator; and
forming a fourth sidewall insulator on the second side surface of the gate electrode and the side surface of the trench via the second sidewall insulator.

13. The method of claim 12, wherein a height of a bottom surface of the fourth sidewall insulator is set lower than a height of a bottom surface of the third sidewall insulator.

14. The method of claim 11, further comprising:
forming a semiconductor layer to be adjacent to the second sidewall insulator in the trench;
forming a third sidewall insulator on the first side surface of the gate electrode via the first sidewall insulator; and
forming a fourth sidewall insulator on the second side surface of the gate electrode via the second sidewall insulator, the fourth sidewall insulator being formed on a top surface of the semiconductor layer.

15. The method of claim 14, wherein the drain region is continuously formed in the substrate and in the semiconductor layer.

16. The method of claim 14, wherein a height of the top surface of the semiconductor layer is set higher or lower than a height of a top surface of the substrate.

17. The method of claim 14, wherein a thickness of the semiconductor layer is set 20 nm or more.

18. The method of claim 11, further comprising:
forming a source extension region of a first conductivity type under the first sidewall insulator between the source and drain regions; and
forming a drain extension region of a second conductivity type under the second sidewall insulator between the source and drain regions.

* * * * *